United States Patent
Lin

(10) Patent No.: US 8,569,777 B2
(45) Date of Patent: Oct. 29, 2013

(54) LEAD FRAME UNIT, PACKAGE STRUCTURE AND LIGHT EMITTING DIODE DEVICE HAVING THE SAME

(75) Inventor: Chen-Hsiu Lin, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 525 days.

(21) Appl. No.: 12/588,601

(22) Filed: Oct. 21, 2009

(65) Prior Publication Data

US 2010/0102348 A1 Apr. 29, 2010

(30) Foreign Application Priority Data

Oct. 23, 2008 (CN) .......................... 2008 1 0218661

(51) Int. Cl.
*H01L 33/00* (2010.01)
(52) U.S. Cl.
USPC ........ 257/98; 257/666; 257/692; 257/E23.01; 257/E23.03; 257/E33.059
(58) Field of Classification Search
USPC .................................................... 257/98, 99
See application file for complete search history.

(56) References Cited

U.S. PATENT DOCUMENTS

| | | | |
|---|---|---|---|
| 6,486,543 B1 * | 11/2002 | Sano et al. ..................... | 257/684 |
| 2008/0062711 A1 * | 3/2008 | Veenstra et al. .............. | 362/546 |
| 2008/0079019 A1 * | 4/2008 | Huang et al. ................... | 257/99 |
| 2009/0020778 A1 * | 1/2009 | Noichi ........................... | 257/99 |
| 2010/0123156 A1 * | 5/2010 | Seo et al. ....................... | 257/99 |

* cited by examiner

*Primary Examiner* — Thao Le
*Assistant Examiner* — Sheng Zhu
(74) *Attorney, Agent, or Firm* — Rosenberg, Klein & Lee

(57) ABSTRACT

A package structure is adapted for mounting at least one light emitting diode (LED) die. The package structure includes an insulating housing, and a lead frame unit including two spaced-apart conductive bodies. Each of the conductive bodies has opposite first and second conductive terminals spaced-apart from each other along an axial direction. The first conductive terminals extend into the insulating housing. The second conductive terminals are exposed outwardly of the insulating housing. Each of the conductive bodies further has two side edges spaced-apart from each other along a transverse direction perpendicular to the axial direction, and a concave-convex structure disposed at the side edges and surrounded by the insulating housing.

15 Claims, 4 Drawing Sheets

LEAD FRAME UNIT, PACKAGE STRUCTURE AND LIGHT EMITTING DIODE DEVICE HAVING THE SAME

CROSS-REFERENCE TO RELATED APPLICATION

This application claims priority of Chinese Patent Application No. 200810218661.6, filed on Oct. 23, 2008.

BACKGROUND OF THE INVENTION

1. Field of the Invention

The invention relates to a lead frame unit, more particularly to a lead frame unit adapted for mounting a light emitting diode die, and a package structure having the lead frame unit structure.

2. Description of the Related Art

The assembly of conductive supports and an insulating housing of a conventional light emitting diode (LED) has a problem. That is, the process of bending each of the conductive supports to form a hook end against a bottom part of the insulating housing so as preventing removal of the conductive supports is troublesome. Furthermore, due to such shape of the conductive supports, the total height of the conventional LED device is increased significantly.

SUMMARY OF THE INVENTION

Therefore, the object of the present invention is to provide an LED device with an improved lead frame unit, which is attached firmly to an insulating housing in such a manner that the total height of the LED device is decreased and removal of the lead frame unit from the insulating housing is prevented.

According to an aspect of the present invention, a lead frame unit is adapted to form the LED device. The lead frame unit comprises two conductive bodies. Each of the conductive bodies has a first conductive terminal and a second conductive terminal spaced-apart from each other along an axial direction. Each of the conductive bodies further has first and second side edges spaced-apart from each other along a transverse direction perpendicular to the axial direction, and a concave-convex structure disposed at the first and second side edges. Due to the presence of the concave-convex structures of the conductive bodies, the contact area between an insulating housing, which is covered on the conductive bodies, and the conductive bodies is increased to form a firm attachment between the conductive bodies and insulating housing, thereby preventing removal of the conductive bodies from the insulating housing.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
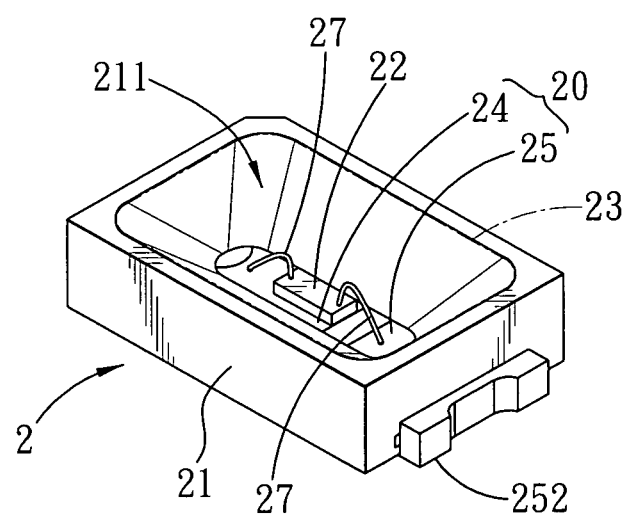
FIG. 1 is a perspective view of a preferred embodiment of a light emitting diode device according to the present invention.

Before the present invention is described in greater detail, it should be noted that like elements are denoted by the same reference numerals throughout the disclosure.

As shown in FIG. 1, a preferred embodiment of a light emitting diode (LED) device 2 according to the present invention comprises a lead frame unit 20, an insulating housing 21 formed on the lead frame unit 20, an LED die 22 disposed on the lead frame unit 20, and a light transmissive encapsulating material 23 integrated with the insulating housing 21 for covering the LED die 22.

Figure 2:
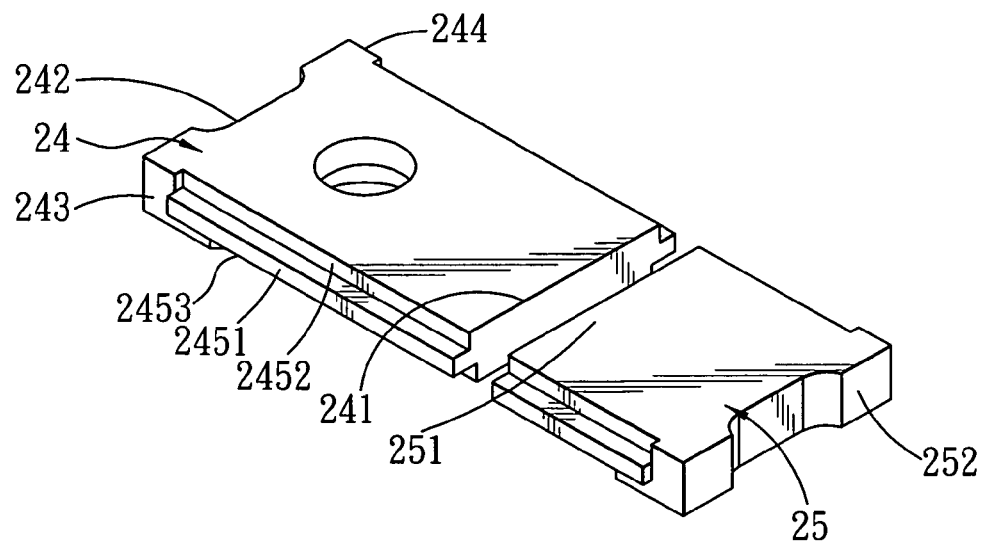
FIG. 2 is a top perspective view of a lead frame unit of the preferred embodiment according to the present invention.
Figure 3:
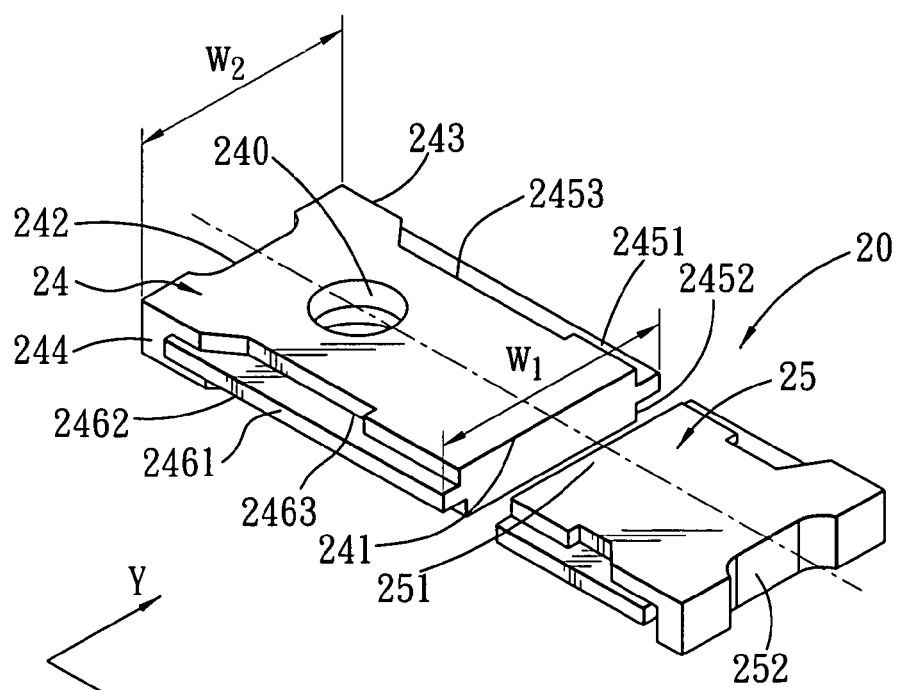
FIG. 3 is a bottom perspective view of the lead frame unit of the preferred embodiment.

Further referring to FIGS. 2 and 3, the lead frame unit 20 includes two spaced-apart conductive bodies 24, 25. The conductive body 24 has opposite first and second conductive terminals 241, 242 spaced-apart from each other along an axial direction (X), i.e., a left-to-right direction in the drawings. The conductive body 25 has opposite first and second conductive terminals 251, 252 spaced-apart from each other along the axial direction (X). The first conductive terminals 241, 251 extend into the insulating housing 21, and the second conductive terminals 242, 252 are exposed outwardly of the insulating housing 21. The LED device 2 further comprises a cavity 211 disposed within the insulating housing 21. In this preferred embodiment, a portion of each of the first conductive terminals 241, 251 of the conductive bodies 24, 25 are disposed in the cavity 211.

The conductive body 24 further has first and second side edges 243, 244 spaced-apart from each other along a transverse direction (Y) perpendicular to the axial direction (X), and a concave-convex structure disposed at the side edges 243, 244 and surrounded by the insulating housing 21. The conductive body 25 has a concave-convex structure disposed at two side edges of the conductive body 25. In the preferred embodiment, the configurations of the concave-convex structures of the conductive bodies 24, 25 are substantially the same. Therefore, the invention is exemplified using the left conductive body 24 in the following.

Figure 4:
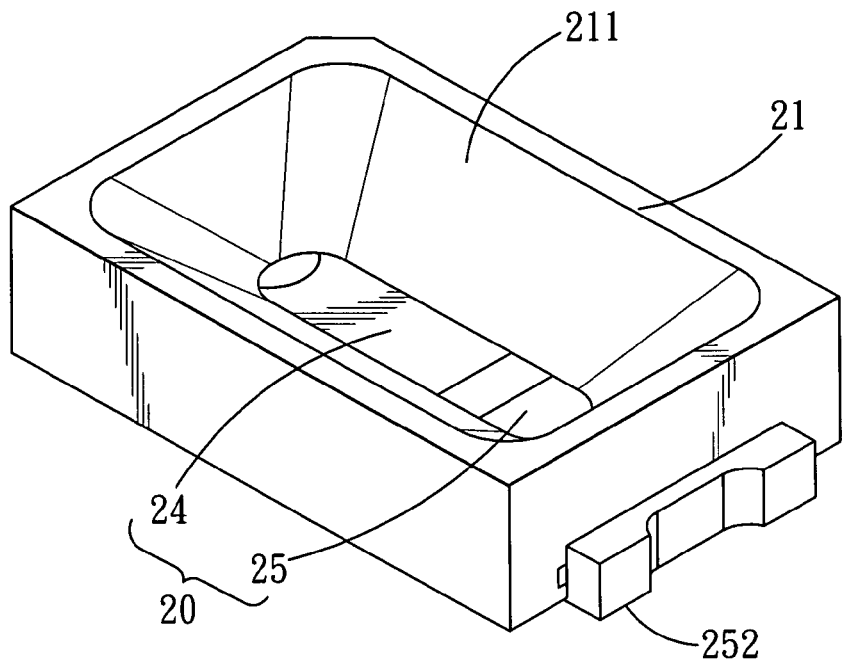
FIG. 4 is a perspective view of the lead frame unit and an insulating housing of the preferred embodiment.
Figure 5:
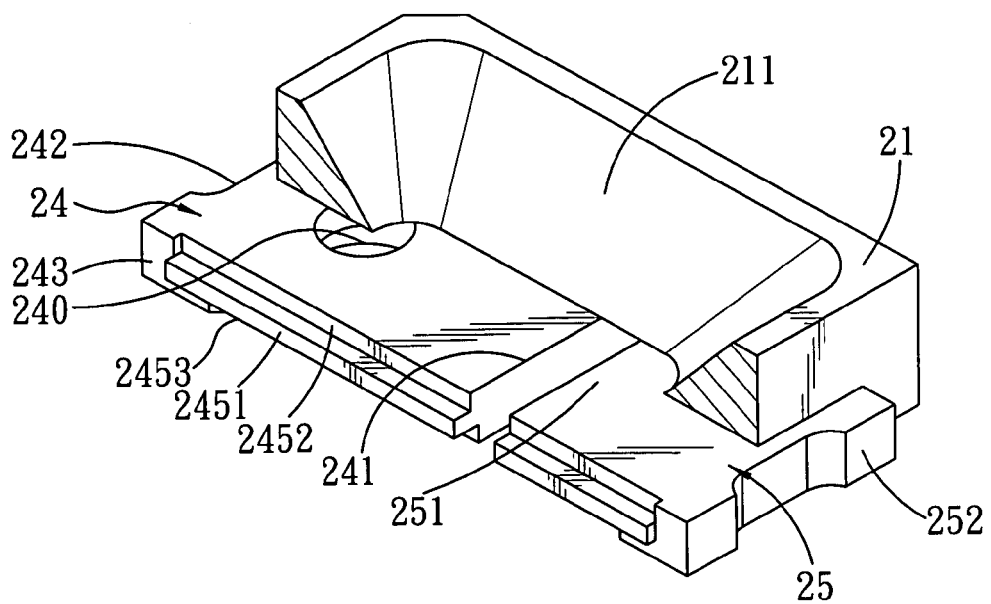
FIG. 5 is a perspective fragmentary sectional view of FIG. 4.

In this preferred embodiment, the left conductive body 24 further has a hole 240 for injecting a plastic material to cover the lead frame unit 20 as the insulating housing 21 in a mold manner, as best shown in FIGS. 4 and 5.

The concave-convex structure of the left conductive body 24 includes first and second protrusions 2451, 2461 formed respectively on the first and second side edges 243, 244 thereof. The first and second protrusions 2451, 2461 extend along the axial direction (X), project respectively from the first and second side edges 243, 244 of the conductive body 24 away from each other, and are located in a horizontal plane. The concave-convex structure of the left conductive body 24 further includes a pair of first and second notches 2452, 2462 formed respectively in the first and second side edges 243, 244 thereof. The first and second notches 2452, 2462 extend along the axial direction (X), are concaved toward each other, and are located respectively above and under a corresponding one of the first and second protrusions 2451, 2461. The first and second notches 2452, 2462 are located in another horizontal plane. The concave-convex structure of the left conductive body 24 further includes a pair of third and fourth notches 2453, 2463 formed respectively in the first and second side edges 243, 244 thereof. The third and fourth notches 2453, 2463 extend along the axial direction (X), are concaved toward each other, are adjacent respectively to the first and second protrusions 2451, 2461, and are located respectively above and under a corresponding one of the first and second protrusions 2451, 2461.

Figure 6:
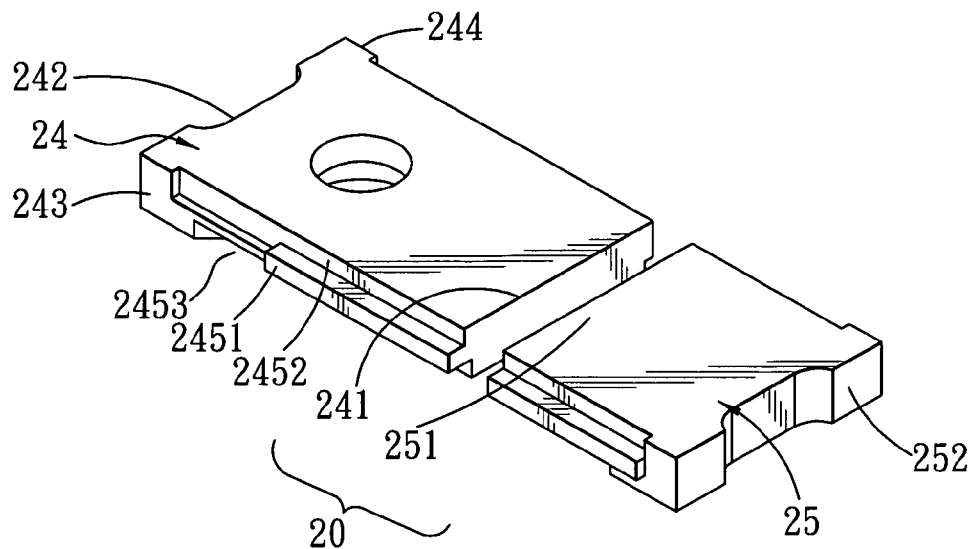
FIG. 6 is a top perspective view of a modified lead frame unit.
Figure 7:
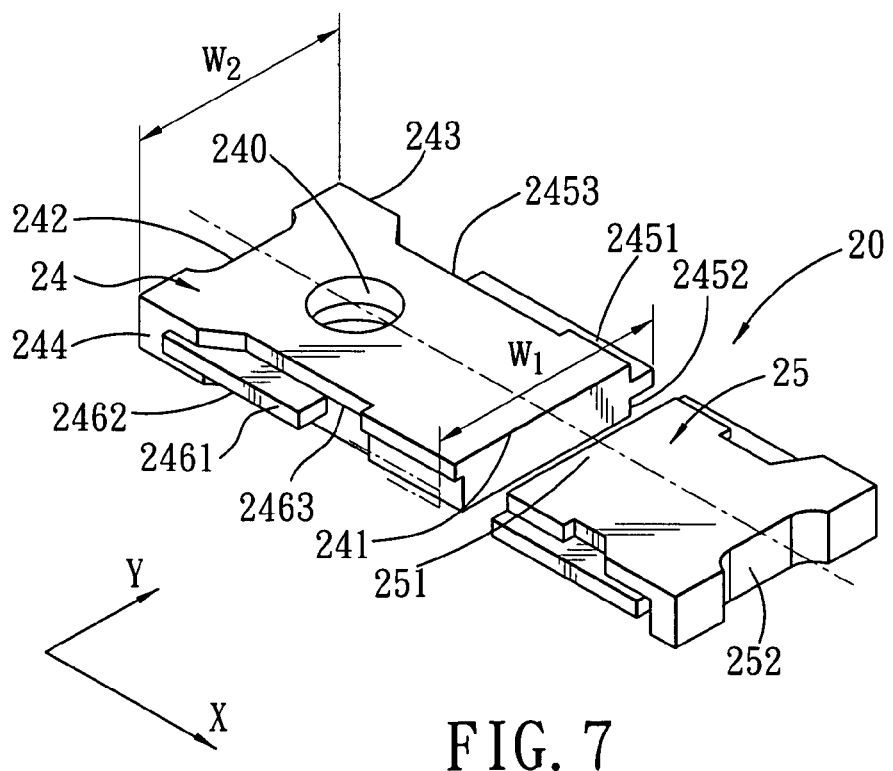
FIG. 7 is a bottom perspective view of the modified lead frame unit.

The concave-convex structure of the left conductive body 24 is not limited to the aforementioned structure. For example, either the first and second notches 2452, 2462 or the third and fourth notches 2453, 2463 may be omitted from the concave-convex structure, and the first and second notches 2452, 2462 may be located respectively in different horizontal planes. Referring to FIGS. 6 and 7, in a modified lead frame unit 20, the extension lengths of the first and second protrusions 2451, 2461 along the axial direction (X) may be shortened such that the first and second protrusions 2451, 2461 are adjacent respectively to the first and second conductive terminals 241, 242 of the left conductive body 24.

In the preferred embodiment, the left conductive body 24 has a maximum width ($w_1$) along the transverse direction (Y) at a portion other than the second conductive terminal 242 thereof as a result of disposition of the concave-convex structure at the first and second side edges 243, 244 of the left conductive body 24. In other words, the left conductive body 24 has a width ($w_2$) along the transverse direction (Y) as the second conductive terminal 242, which is smaller than the maximum width ($w_1$).

Referring to FIGS. 1, 2, 4, and 5, the LED die 22 is disposed on the lead frame unit 20 and in the cavity 211. A pair of wires 27 respectively and electrically connect the LED die 22 to the first conductive terminals 241, 251 of the conductive bodies 24, 25. The second conductive terminals 242, 252 of the conductive bodies 24, 25 are electrically connected to an external power source (not shown) to enable the LED die 22 to emit light. The light transmitting encapsulating material 23 covers the LED die 21 and fills with the cavity 211 of the insulating housing 21 (see FIG. 1). An inner wall defining the cavity 211 is used as a light reflection layer. To reflect light, the insulating housing 21 may be made of a reflective material, or the inner wall may be applied with the reflective material.

It should be noted that, due to the presence of the concave-convex structures, a contact area between the insulating housing 21 and the conductive bodies 24, 25 of the lead frame unit 20 is increased, thus providing a steady attachment between the insulating housing 21 and the conductive bodies 24, 25. Furthermore, since the conductive body 24 has the maximum width ($w_1$) along the transverse direction (Y) at a portion other than the second conductive terminal 242, as described above, removal of the conductive bodies 24, 25 from the insulating housing 21 can be prevented. Further, the conductive bodies 24, 25 are embedded in the insulating housing 21 in such a manner that the second conductive terminals 242, 252 are exposed outwardly of the insulating housing 21 and can be electrically connected to the external power source. When compared to that disclosed in the aforementioned prior art, a process for bending the conductive supports is eliminated, and the total height of the LED device 2 of this invention is decreased.

It should be noted that, alternatively, the concave-convex structures may be shaped as a step, a saw tooth, or a wave. Additionally, the portions of the concave-convex structures at the first and second side edges 243, 244 of the left conductive body 24 may differ from each other in the numbers and positions of the protrusions and the notches.

While the present invention has been described in attachment with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A package structure adapted for mounting at least one light emitting diode (LED) die, said package structure comprising:
   an insulating housing; and
   a lead frame unit including:
      two spaced-apart conductive bodies, each of said conductive bodies having opposite first and second conductive terminals spaced-apart from each other along an axial direction, said first conductive terminal extending into said insulating housing, said second conductive terminal being exposed outwardly of said insulating housing, wherein each of said conductive bodies further has two side edges spaced-apart from each other along a transverse direction perpendicular to the axial direction and extending substantially in parallel to each other along substantially the entire length of said each conductive body, and
      each of said conductive bodies being integrally formed and having a protrusion that extends in a transverse direction from a side surface thereof and that defines a step contoured structural body in an upper section of said conductive body and a ledge being contiguous with a notch formed within said structural body in a lower section of said conductive body;
      said notch and said ledge being configured into a concave-convex structure disposed along each of said two side edges, wherein each said concave-convex structure is surrounded by said insulating housing;
   wherein said each concave-convex structure of at least one of said two conductive bodies has said ledge and notch formed along a respective one of said two side edges of said at least one conductive body;
   wherein, in said each concave-convex structure, said protrusion, said ledge and said at least one notch are disposed each with respect to the other along a direction perpendicular to said axial direction and said transverse direction; and
   wherein said at least one conductive body, at a portion thereof surrounded by said insulating housing, has a first width defined along said transverse direction between outermost edges of said protrusions formed at said opposite side edges, and wherein said first width exceeds a width of said second conductive terminal exposed outwardly of said insulating housing.

2. The package structure as claimed in claim 1, wherein said protrusions extend along the axial direction and project respectively from said side edges of said at least one conductive body away from each other.

3. The package structure as claimed in claim 1, wherein each said protrusion is disposed adjacent to a respective one of said first and second conductive terminals of said at least one conductive body, said each protrusion projecting respectively from a respective one of said side edges of said at least one conductive body away from a protrusion formed at a side edge opposite to said respective side edge.

4. The package structure as claimed in claim 1, wherein said protrusions of said concave-convex structures extend along the axial direction and project from said side edges of said at least one conductive body away from each other, and wherein said notches extend along the axial direction in a concaved relationship toward each other.

5. The package structure as claimed in claim 4, wherein said protrusions are located in a first horizontal plane, and wherein said notches are located in a second horizontal plane different than said first horizontal plane.

6. The package structure as claimed in claim 1, wherein said concave-convex structure of said at least one conductive body further includes a pair of notches formed respectively t said each side edge, said notches, in each pair thereof, being located respectively above and under a corresponding one of said protrusions.

7. A light emitting diode (LED) device comprising:
package structure adapted thr mounting at least one light emitting diode (LED) die, said package structure comprising:
an insulating housing; and
a lead frame unit including:
two spaced-apart conductive bodies, each of said conductive bodies having opposite first and second conductive terminals spaced-apart from each other along an axial direction, said first conductive terminal extending into said insulating housing, said second conductive terminal being exposed outwardly of said insulating housing,
each of said conductive bodies further having two side edges spaced-apart from each other along a transverse direction perpendicular to the axial direction, and extending substantially in parallel to each other along substantially the entire length of said each conductive body, and
each of said conductive bodies being integrally formed and having a protrusion that extends in a transverse direction from a side surface thereof and that defines a step contoured structural body in an upper section of said conductive body and a ledge being contiguous with a notch formed within said structural body in a lower section of said conductive body;
said notch and said ledge being configured into a concave-convex structure disposed at each of said two side edges and surrounded by said insulating housing;
wherein each said concave-convex structure of at least one of said two conductive bodies has said ledge and notch formed along said respective side edge of aid at least one conductive body;
wherein, in said each concave-convex structure, said protrusion, said ledge and said at least one notch are disposed each with respect to the other along a direction perpendicular to said axial and transverse direction; and
wherein said at least one conductive body, at a portion thereof surrounded by said insulating housing, has a first width defined along said transverse direction between outermost edges of said protrusions formed at said opposite side edges, and wherein said first width exceeds a width of said second conductive terminal exposed outwardly of said insulating housing; and
a light emitting diode (LED) die disposed at one of said conductive bodies and electrically connected to said two conductive bodies.

8. The LED device as claimed in claim 7, further comprising a cavity disposed within said insulating housing and a light transmissive encapsulating material filling said cavity and covering said LED die.

9. The LED device as claimed in claim 7, wherein said protrusions extend along the axial direction and project respectively from said side edges of said at least one of said conductive body away from each other, said notches extending along the axial direction in a concaved relationship toward each other.

10. A lead frame unit, comprising:
two conductive bodies spaced-apart along an axial direction, at least one of said conductive bodies including a first side edge and a second side edge spaced-apart from each other along a transverse direction perpendicular to the axial direction and extending substantially in parallel to each other along substantially the entire length of said each conductive body,
each of said conductive bodies being integrally formed and having a protrusion that extends in a transverse direction from a side surface thereof and that defines a step contoured structural body in an upper section of said conductive body and a ledge being contiguous with a notch formed within said structural body in a lower section of said conductive body;
said notches and said ledge being configured into a concave-convex structure
wherein said at least one conductive body has a first width defined along said transverse direction between outermost edges of said ledge and said protrusion formed at said opposite side edges, and
wherein said first width exceeds a width of said at least one conductive body at a location different than a portion formed with said protrusions.

11. The lead frame unit as claimed in claim 10, wherein said first and second protrusions are located in a first horizontal plane, and said first and second notches are located in a second horizontal plane different than said first horizontal plane.

12. The lead frame unit as claimed in claim 10, wherein said first and second protrusions extend horizontally along the axial direction, and project respectively from said side edges of said at least one conductive body away from each other, said first and second notches of the said at least one conductive body extending along the axial direction in a concaved relationship toward each other.

13. The lead frame unit as claimed in claim 10, wherein the said at least one conductive body further includes a pair of third and fourth notches, each formed respectively along said first and second side edges, said third and fourth notches being adjacent to said first and second protrusions, respectively, said third and fourth notches being located in a horizontal plane.

14. The lead frame unit as claimed in claim 13, wherein said first and second protrusions extend horizontally along the axial direction, and project respectively from said first and second side edges of said at least one conductive body away from each other, said first and second notches of said at least one conductive body being concaved toward each other along a horizontal direction, and said third and fourth notches of said at least one conductive body being concaved toward each other along the horizontal direction.

15. The lead frame unit as claimed in claim 10, wherein each of said conductive bodies has opposite first and second conductive terminals spaced-apart from each other along the axial direction, wherein each of said conductive bodies has said first width exceeding a width a one of said first and second conductive terminals formed without said concave-convex structures.

* * * * *